(12) United States Patent
Martin et al.

(10) Patent No.: US 12,224,582 B2
(45) Date of Patent: Feb. 11, 2025

(54) POWER SUPPLY FOR AN AIRCRAFT

(71) Applicant: Rolls-Royce Deutschland Ltd & Co KG, Blankenfelde-Mahlow (DE)

(72) Inventors: Patrick Martin, Indianapolis, IN (US); Erik Munevar, Indianapolis, IN (US)

(73) Assignee: Rolls-Royce Deutschland Ltd & Co KG, Blankenfelde-Mahlow (DE)

( * ) Notice: Subject to any disclaimer, the term of this patent is extended or adjusted under 35 U.S.C. 154(b) by 93 days.

(21) Appl. No.: 18/101,213

(22) Filed: Jan. 25, 2023

(65) Prior Publication Data

US 2024/0250527 A1    Jul. 25, 2024

(51) Int. Cl.
*H02J 1/10*  (2006.01)
*B64C 29/00* (2006.01)
*B64D 41/00* (2006.01)
*G01R 19/10* (2006.01)
*H02M 3/02*  (2006.01)

(52) U.S. Cl.
CPC ............ *H02J 1/10* (2013.01); *B64C 29/0008* (2013.01); *B64D 41/00* (2013.01); *G01R 19/10* (2013.01); *H02M 3/02* (2013.01); *B64D 2221/00* (2013.01)

(58) Field of Classification Search
CPC ........ H02J 1/10; B64C 29/0008; B64D 41/00; B64D 2221/00; G01R 19/10; H02M 3/02
See application file for complete search history.

(56) References Cited

U.S. PATENT DOCUMENTS

2017/0158321 A1\* 6/2017 Mia ...................... B64C 29/005
2023/0117539 A1\* 4/2023 Detweiler ........... H02J 7/00712
                                                                307/24

\* cited by examiner

*Primary Examiner* — Lincoln D Donovan
*Assistant Examiner* — Alex W Lam
(74) *Attorney, Agent, or Firm* — Lempia Summerfield Katz LLC

(57) ABSTRACT

A power supply for an aircraft comprises: an input configured to receive electrical power from an energy source, an output for supplying electrical power, a plurality of converters, each of which being electrically connected to the input to receive electrical power from the input and being configured to convert the electrical power and to provide the converted electrical power to the output, and a control unit being configured to individually control each of the plurality of converters.

20 Claims, 4 Drawing Sheets

1 Power supply
10 Input
11 Output
12 Converter
13 Power path
14 Control unit
15 Current sensor
16, 17 Communication links
120 Input
121 Output
122 Communication interface
140 Communication interface
141 Sensor input
142 Communication interface
143 Processor
144 Memory 2 Aircraft
20 Fuselage
21 Wings
22 Rotor unit
23 Electric machine
220 Rotor blade 2' Aircraft
20 Fuselage
21 Wings
22 Rotor unit
24 Energy source
24' Energy source
25 Turbine
220 Rotor blade 1  Power supply
3  System
18  Cooling system
24  Energy source
26  Power consumer 1  Power supply
10  Input
11  Output
12  Converter
13  Power path
14  Control unit
15  Current sensor
16, 17  Communication links 120  Input
121  Output
122  Communication interface
140  Communication interface
141  Sensor input
142  Communication interface
143  Processor
144  Memory 1  Power supply
3' System
30 Power distribution unit
31, 32, 33  Power buses

POWER SUPPLY FOR AN AIRCRAFT

TECHNICAL FIELD

The present disclosure particularly relates to a power supply for an aircraft, to a system, and to a method of controlling a power supply.

BACKGROUND

Aircraft may include numerous electrical consumers, for example, a flight control system, monitoring systems, and communication systems. A power supply may be provided to convert input power in accordance with the needs of the electrical consumers. For example, if the aircraft includes an electrical battery as energy source providing electrical power at a high voltage, the power supply may convert a high voltage (HV) direct current (DC) to a low voltage (LV) or medium voltage (MV) DC.

Electrical consumers may draw current from the power supply at a certain level when operating at a nominal operational mode. In certain, e.g., transient, or exceptional situations, the electrical consumers may require power with a larger current. So, such a power supply may be dimensioned to be capable of providing power at sufficiently high currents for such transient or exceptional situations.

In the aerospace sector, a low total weight may be aimed for. This is a particularly important requirement in electrically driven aircraft where a reduction of the weight may allow to increase the range of the aircraft. This specifically holds for battery-electric aircraft.

Another important aspect is the reliability of the systems of an aircraft, and this particularly is the case for a power supply, because a failure of the power supply can lead to a failure in the operation of one or more of its electrical consumers.

SUMMARY

The object of the present disclosure is to improve the weight and safety of a power supply.

The scope of the present disclosure is defined solely by the appended claims and is not affected to any degree by the statements within this summary. The present embodiments may obviate one or more of the drawbacks or limitations in the related art.

According to an aspect, a power supply for an aircraft includes: an input configured to receive electrical power from an energy source; an output for supplying electrical power; a plurality of converters, each converter being electrically connected to the input to receive electrical power from the input and being configured to convert the electrical power and to provide the converted electrical power to the output; and a control unit configured to individually control each of the plurality of converters.

This is based on the findings that certain power supplies are oversized for a regular operation to be able to cope with transient or exceptional situations and that such an oversizing can lead to an inefficient operation of the converter of the power supply. That is, a converter configured to supply up to 20 kW of LV DC power, but only used at 10 KW can produce more heat than a converter configured to produce up to 10 KW used at 10 kW. This inefficient usage leads to an increased power consumption. Moreover, the additional heat produced in the regular operation may need to be dissipated by a correspondingly dimensioned cooling system. This may include heavier components, such as larger radiators with a larger aerodynamic drag, and so forth. Heavier components and larger aerodynamic drag may even further increase the power consumption.

According to the present disclosure, a power supply includes a plurality of converters that may be switched on and off in accordance with the power needs of the aircraft system. Therefore, each converter of the plurality of converters can be optimized in efficiency, and a smaller cooling system can be used. Although at least two converters instead of just one is provided, a lower power consumption can advantageously be achieved. In addition, a redundancy is gained that allows for increased safety. If, e.g., one converter of the plurality of converters fails, another converter of the plurality of converters may step in to maintain a regular operation.

According to embodiments, the power supply may include one or more, (e.g., all), of the following features. The control unit may be configured to individually activate or deactivate each of the plurality of converters. The control unit may be configured to receive an indication for a current demand, and to individually control each of the plurality of converters based on the indication for the current demand. The control unit may include a communication interface for receiving the indication for the current demand. The indication for the current demand may indicate a first value for a regular long-term operation and a second value for a short-term operation, wherein the second value may be lower than the first value. The control unit may be configured to activate a first predefined number of the converters when the indication for the current demand indicates the first value and to activate a second predefined number of the converters when the indication for the current demand indicates the second value. The second predefined number of the converters may be larger than the first predefined number of the converters. The converters may be DC-DC converters. The converters may be configured to convert a first voltage to a second voltage, where the second voltage is lower than the first voltage. The first voltage may be a high voltage and the second voltage may be a medium or low voltage. Each converter of the plurality of converters may be designed as the others of the plurality of converters. The power supply may include at least two, three, or four or more of the converters. The control unit may include a sensor input operatively connected to a current sensor configured to sense a current provided at the output of the power supply. The control unit may be configured to activate at least one first converter of the plurality of converters and deactivate at least one second converter of the plurality of converters at a first point in time. Also, the control unit may be configured to deactivate the at least one first converter and activate the at least one second converter at a second point in time. A period of time between the first point in time and the second point in time may be preconfigured. The control unit may be configured to activate and deactivate the converters at regular or predefined time intervals.

According to an aspect, a system for an aircraft is provided. The system includes: at least one power bus configured to supply electrical power to one or more power consumers; at least one power supply; and a power distributor configured to electrically connect the at least one power supply to the at least one power bus. The at least one power supply includes: an input configured to receive electrical power from an energy source; an output for supplying electrical power; a plurality of converters, each converter being electrically connected to the input to receive electrical power from the input and being configured to convert the electrical power and to provide the converted electrical power to the output; and a control unit being configured to control each of the plurality of converters.

According to embodiments, the system may include one or more, (e.g., all), of the following features. The at least one power supply of the system may include a plurality of the power supplies. The system may be included in or positioned within an aircraft. The aircraft may be a vertical-take-off-and-landing aircraft. According to an aspect, an aircraft including the power supply and/or the system of any embodiment described herein is provided.

According to an aspect, a method of controlling a power supply is provided, wherein the power supply includes: an input configured to receive electrical power; an output for supplying electrical power; a plurality of converters, each converter being electrically connected to the input to receive electrical power from the input and being configured to convert the electrical power and to provide the converted electrical power to the output; and a control unit. The method includes: receiving, at the input, electrical power from an energy source; receiving, by the control unit, an indication for a current demand; and individually controlling, by the control unit, each converter of the plurality of converters based on the indication for the current demand.

BRIEF DESCRIPTION OF THE DRAWINGS

Exemplary embodiments are now described with reference to the figures; in the figures, in schematic representations.

DETAILED DESCRIPTION

Figure 1:
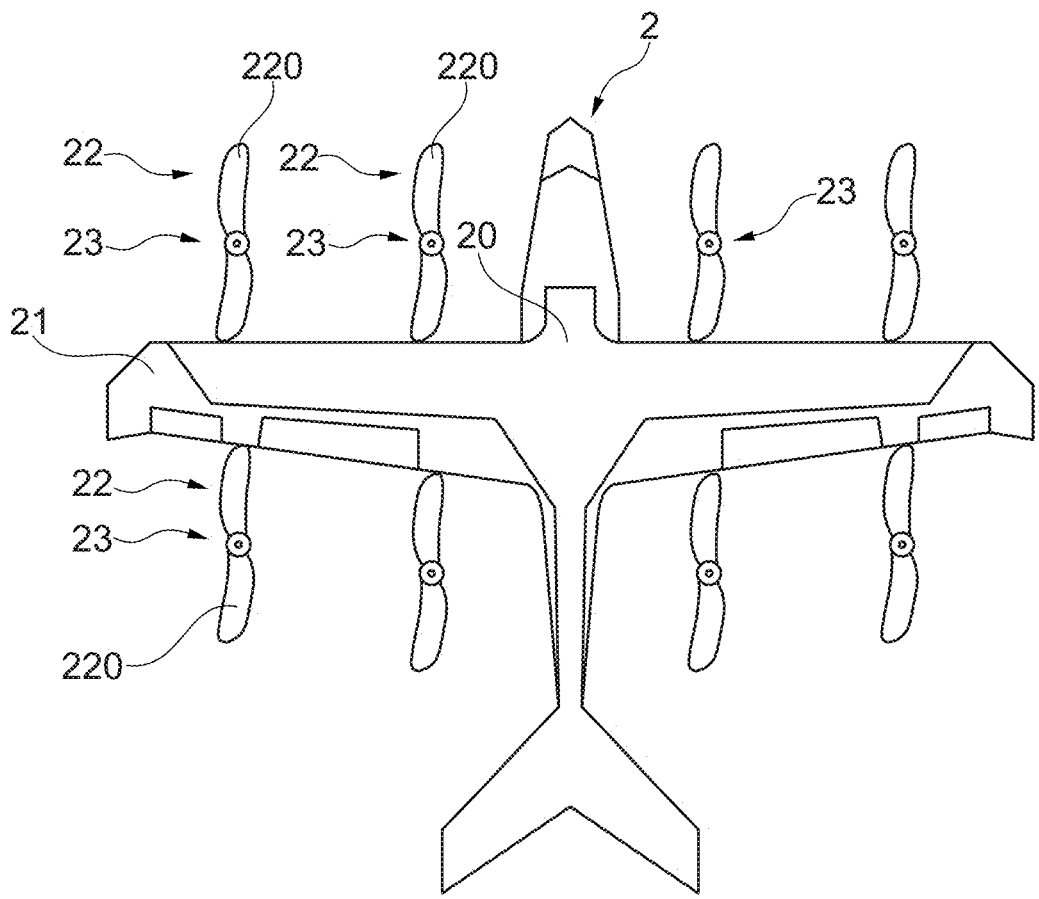
FIG. 1 shows an example of an aircraft for vertical take-off and landing, having a plurality of electrically driven rotor units.

FIG. 1 shows a top view of an aircraft 2 in the form of a vertical take-off and landing (VTOL) aircraft. The aircraft 2 includes a fuselage 20, wings 21, and a plurality of electric machines 23.

The electric machines are mounted on the wings 21. Each of the electric machines 23 drives a rotor unit 22. Each rotor unit 22 includes rotor blades 220. In the present example, each rotor unit 22 is designed as a propeller.

The aircraft 2 has a plurality of (e.g., four) front electric machines 23 and rotor units 22. Therein, each of the front rotor units 22 (or one or more of these and/or other rotor units 22) are pivoted so as to selectively provide thrust in a (at least predominantly) vertical direction, or in a (at least predominantly) horizontal direction. Further, the aircraft 2 includes a plurality of (e.g., four) rear electrical machines 23 and rotor units 22, wherein each of the (rear) rotor unis 22 has a propeller rotational axis with a fixed orientation of with respect to the fuselage 20. These (rear) rotor units 22 are oriented so as to provide thrust in a (at least predominantly) vertical direction.

Figure 2:
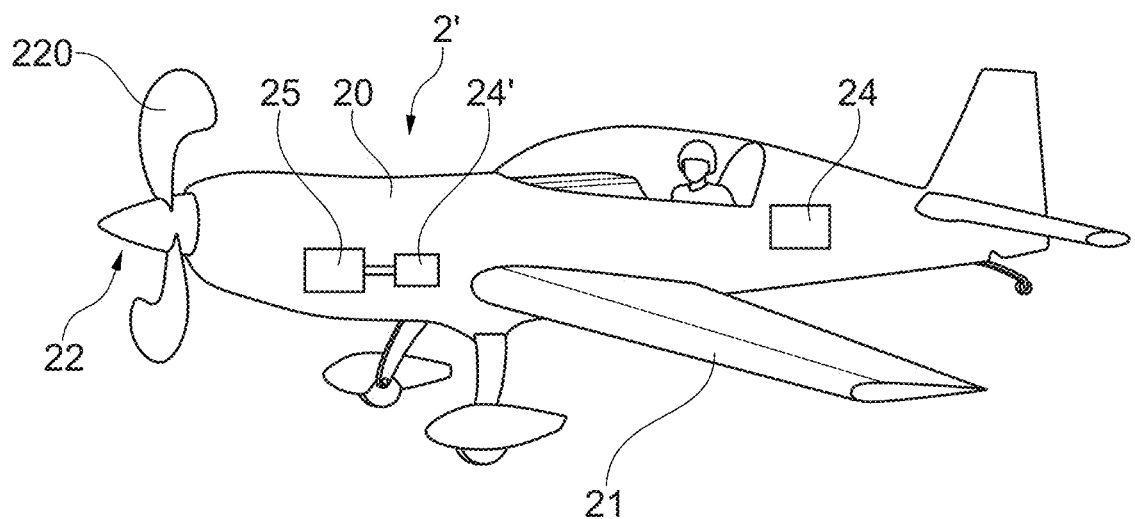
FIG. 2 shows an example of an aircraft in the form of an airplane with a rotor unit and various energy sources.

FIG. 2 shows an aircraft 2' in the form of an airplane having a fuselage 20, wings 21, and one front rotor unit 22.

The aircraft 2' includes an electric machine and/or an engine combusting fuel for driving the rotor unit 22. The rotor unit 22 includes a plurality of rotor blades 220, in this example, two rotor blades 220. In the example shown, the rotor blades 220 are mounted on a hub to form a propeller. In alternative embodiments, the aircraft 2' (or the aircraft 2 of FIG. 1) includes, for example, a fan instead of a propeller and/or a plurality of propellers, fans or the like.

The aircraft 2' further includes one or more energy sources 24, 24'. In the present example, the aircraft 2' includes an electric battery as an energy source 24 and an electric generator as another energy source 24'. The electric generator energy source 24' is driven by a turbine or other engine, e.g., in the form of an auxiliary power unit (APU). Alternatively, or in addition, the electric generator energy source 24' may be driven by an engine driving the rotor unit 22.

It may be provided that electric energy supplied by the electric generator energy source 24' can be stored in the electric battery energy source 24.

Figure 3:
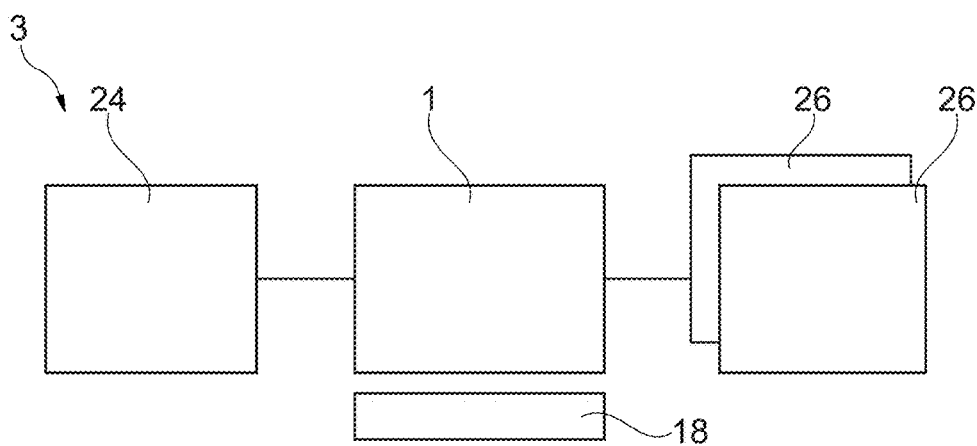
FIG. 3 shows an example of a system for the aircraft of FIG. 1 or 2, including an energy source, a power supply with a cooling system, and power consumers.

FIG. 3 shows a system 3 of the aircraft 2 of FIG. 1 and, similarly, of the aircraft 2' of FIG. 2. The system 3 includes at least one energy source. In this example, the electric battery is an energy source 24. Alternatively, or in addition, the system may include the electric generator as energy source 24' or another type of energy source such as a fuel cell. The energy source 24 of the system 3 is electrically connected to a power supply 1 of the system 3. The power supply 3 receives electrical power from the energy source 24 and provides electrical power for use by one or more power consumers 26. As an example, one of the one or more power consumers 26 may be a flight control system configured to control maneuvers of the respective aircraft 2; 2'. Another example of a power consumer is an air conditioning system. The power supply 1 includes a cooling system 18 to dissipate heat produced by the power supply 1.

In the present example, the power supply 1 receives high voltage (HV) direct current (DC) and provides low voltage (LV) DC, but other configurations are also conceivable. For example, the power supply 1 can be configured to receive DC and supply DC, to receive DC and supply AC, to receive AC and supply DC, or to receive AC and supply AC. Further, the power supply 1 can be configured to receive HV and supply LV (or MV), to receive HV and supply HV, to receive LV (or MV) and supply HV, or to receive LV (or MV) and supply LV (or vice versa).

As disclosed herein, high voltage is higher than medium voltage and low voltage, and medium voltage is higher than low voltage. In certain examples, high voltage may refer to any voltage above that which may cause partial or disruptive discharges in air, e.g., 300 V peak. High voltage may exceed 3 kV. Medium voltage may be in a range of 28 V to 3 kV (e.g., 270 V), and low voltage on aircraft may be 28 V or lower.

In the present example, the energy source 24 is a HV battery, which supplies HV current to drive one or more electric machines 23, which drives one or more rotor units 22. The HV is too high for the power consumers 26, so the power supply 1 converts the HV to LV.

Figure 4:
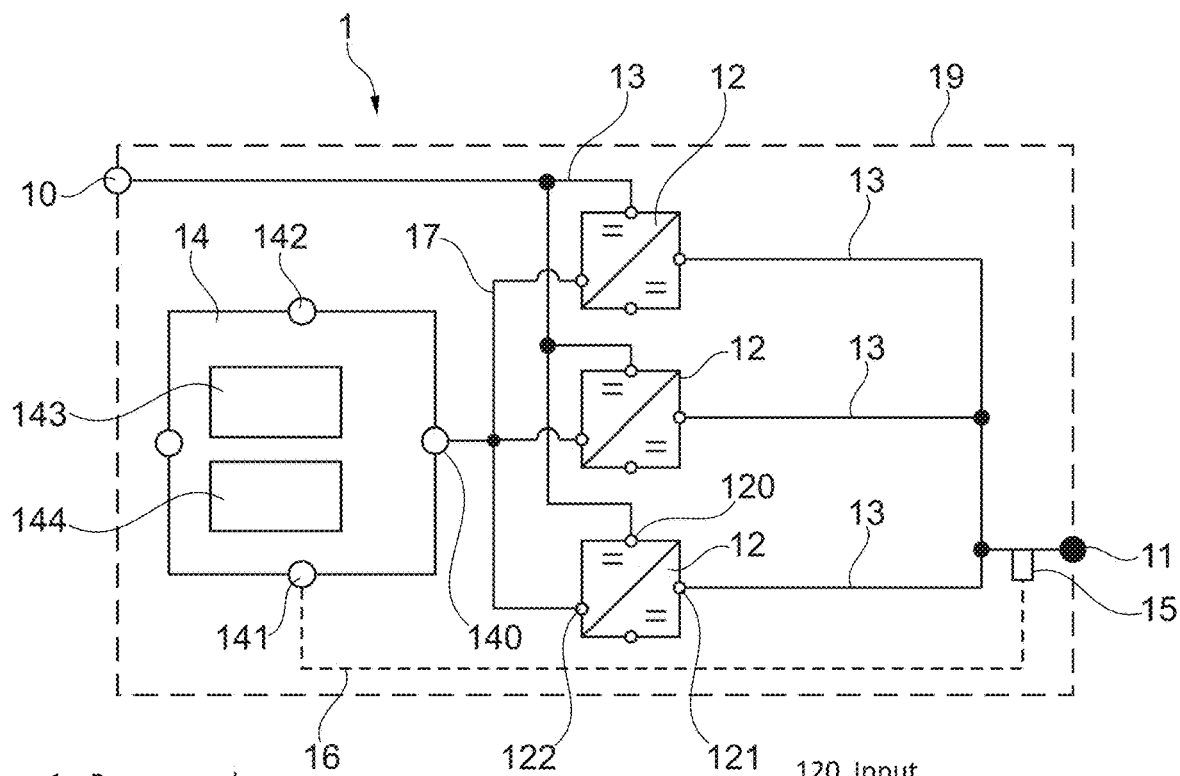
FIG. 4 shows the power supply according to FIG. 3.

FIG. 4 shows a schematic block diagram of the power supply 1 package. As shown, the power supply 1 includes an input 10, wherein the input 10 is configured to receive electrical power from the energy source 24. In use, the input 10 is electrically connected to the energy source 24. The power supply 1 further includes an output 11 for supplying electrical power for the one or more power consumers 26.

The power supply 1 further includes a plurality of converters 12, in this example exactly three converters 12. Each converter of the plurality of converters 12 is electrically connected to the input 10 to receive electrical power from the input 10 and is configured to convert the electrical power from the input 10 and to provide the converted electrical power to the output 11. The power supply 1 also includes a control unit 14 being configured to individually control each of the plurality of converters 12.

The converters 12 are DC-DC converters each. The converters 12 are electrically connected in parallel to one another. For this, each of the converters 12 has an input 120 electrically connected to the power supply 1 input 10. Further, each of the converters 12 has an output 121 electrically connected to the power supply 1 output 11. The connections to the input 10 and the connections to the output 11 include parallel power paths 13.

While the converters could be designed differently, in the present example, the converters 12 are all designed the same.

The converters 12 are arranged within a housing 19, in this example. Here, the input 10 and output 11 are provided on walls of the housing 19, but other arrangements are also possible. In the present example, the control unit 14 is arranged in the housing, too.

Each converter of the plurality of converters 12 further includes a communication interface 122. The control unit 14 includes a communication interface 140. The communication interface 140 of the control unit 14 is communicatively connected with each of the communication interfaces 122 of the converters 12 via a communication link 17. The control unit 14 controls the converters 12 by communication via the communication interfaces 140, 122 and the communication link 17 there between.

The control unit 14 further includes a sensor input 141. The sensor input 141 is coupled to a current sensor 15 (or other type of sensor). The current sensor 15 senses the current provided at the power supply 1 output 11. The current sensor 15 senses the sum of the currents provided by the converters 12.

Furthermore, the control unit 14 includes a communication interface 142 for communication with an external device, (e.g., a flight control, an engine, an electric machine control, or the like).

The control unit 14 includes a processor 143 and memory 144 readable by the processor 143. The memory 144 stores a program executable by the processor 143 for controlling the converters 12.

The control unit 14 controls the converters 12 in accordance with a current demand that may be received via its communication interface 142. Specifically, the control unit 14 is configured to receive an indication for a current demand (e.g., via the communication interface 142) and to individually control each of the plurality of converters 12 based on the indication for the current demand. As an example, each of the converters 12 is configured to provide 10 KW (maximum). Thus, when 20 kW are needed, the control unit 14 activates two of the converters 12 and deactivates the remaining converter 12. Therefore, the control unit 14 is configured to selectively activate or deactivate each converter of the plurality of converters 12 individually. However, if the current demand is only 10 KW or less, the control unit 14 activates only one converter 12. For example, 10 KW may be required in a nominal, long-term operation (e.g., cruising flight), while 20 kW may be required only in short-term operations, such as transient flight situations, e.g., take-off, landing other specific maneuvering situations, or in exceptional cases in which other devices, (e.g., another power supply), of the aircraft 2, 2' fail. As an example, the indication for the current demand may indicate a first value for the nominal long-term operation and a second value for the short-term operation, wherein the second value is lower than the first value. Since the higher current demand is only active for a comparably short time period, the cooling system 18 may be designed comparably small and lightweight.

The control unit 14 is configured to activate a first predefined number (e.g., one) of the converters 12 when the indication for the current demand indicates the first value and to activate a second predefined number (e.g., 2 or 3) of the converters 12 when the indication for the current demand indicates the second value. The second predefined number of the converters 12 may be larger than the first predefined number of the converters 12.

In operation, the converters 12 are configured to convert a first voltage (e.g., a HV DC) to a second voltage (e.g., a LV DC), lower than the first voltage.

Using the current sensor 15, the control unit 14 is further configured to monitor whether the provided current at the output 11 corresponds to the setting of the converters 12 made by the control unit 14 in response to the received current demand. In case of a mismatch, the control unit 14 may detect an internal fault, e.g., a defective converter 12. In such a case, the control unit 14 changes the selection of the activated and deactivated converters 12.

In addition to such a redundancy, the control unit 14 of the present example is configured to activate at least one first converter 12 of the converters 12 and deactivate at least one second converter 12 of the converters 12 at a first point in time and to deactivate the at least one first converter 12 and activate the at least one second converter 12 at a second point in time. A period between the first point in time and the second point in time may be preconfigured, e.g., stored in the memory 144. By changing the activated one of the converters 12, the lifetime of all of the converters 12 can be increased. As a specific example, the control unit 14 may be configured to activate and deactivate the converters 12 at regular time intervals.

Figure 5:
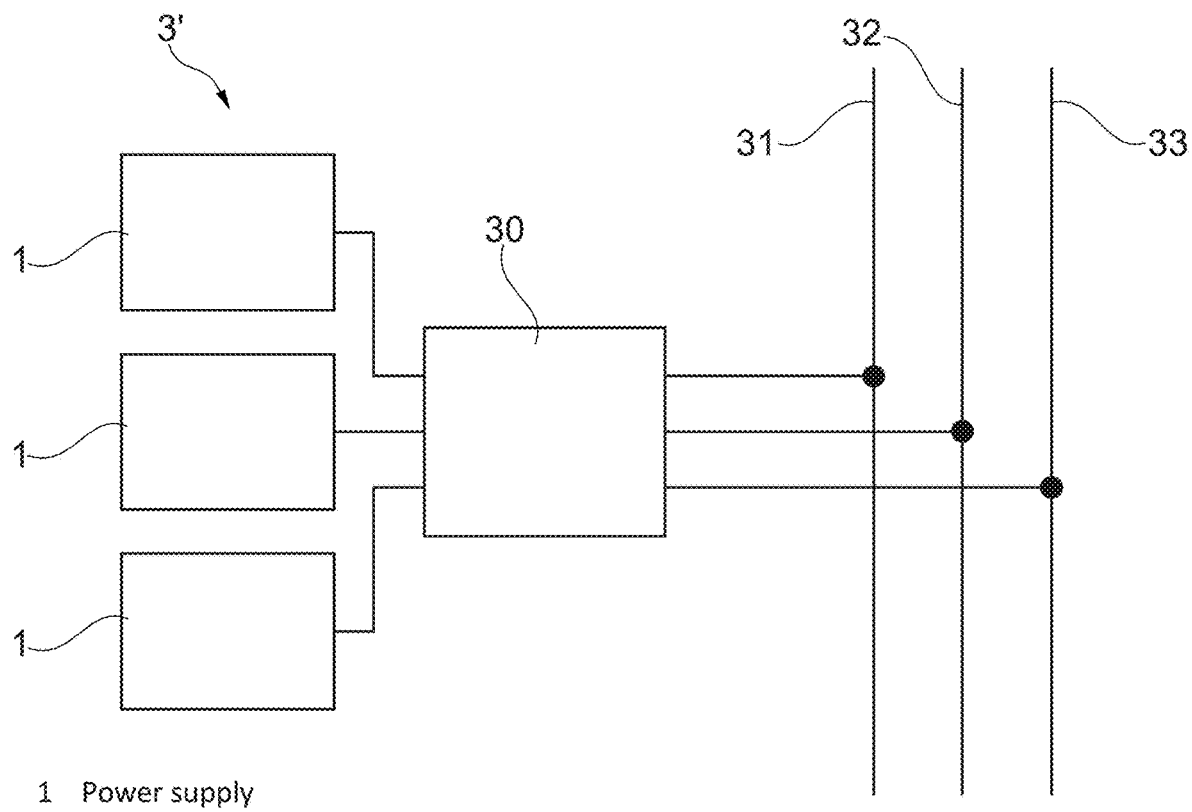
FIG. 5 shows an example of a system with a plurality of power supplies according to FIG. 4, supplying electrical power to a plurality of power buses via a power distribution unit.

FIG. 5 shows a system 3' of the aircraft 2 of FIG. 1 and, similarly, of the aircraft 2' of FIG. 2. The system 3' includes at least one power bus 31, 32, 33, in this example, a plurality of power buses 31, 32, 33, (e.g., three power buses), to supply electrical power to one or more power consumers, at least one power supply 1, in particular, a plurality of power supplies 1, in this example three. Each of the power supplies 1 includes: an input 10 configured to receive electrical power from an energy source 24, 24'; an output 11 for supplying electrical power; a plurality of converters 12, each converter being electrically connected to the input 10 to receive electrical power from the input 10 and being configured to convert the electrical power and to provide the converted electrical power at the output 11; and a control unit 14 configured to control each of the plurality of converters 12. Each of the power supplies 1 may be designed as the power supply 1 of FIG. 4. The system 3' further includes a power distribution unit 30 configured to electrically connect the at least one power supply 1 (the power supplies 1) to the at least one power bus 31, 32, 33 (the power buses 31, 32, 33). This allows additional redundancy, provides sufficient power even if one control unit 14 fails, or the like.

Figure 6:
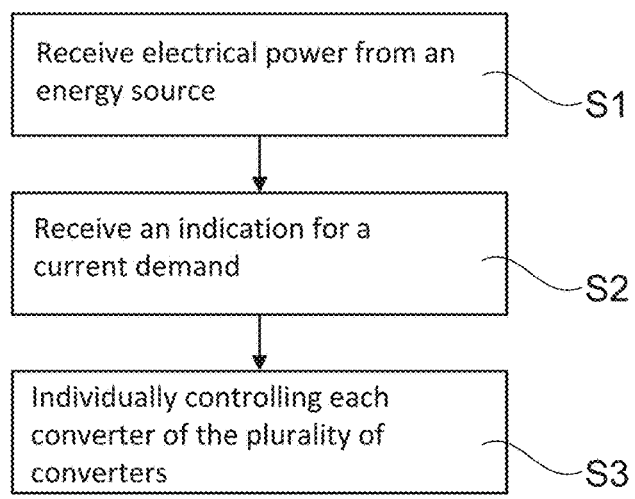
FIG. 6 shows an example of a method of controlling a power supply.

FIG. 6 shows a method of controlling a power supply 1 (e.g., the power supply 1 of FIG. 4), wherein the power supply includes: an input 10 configured to receive electrical power; an output 11 for supplying electrical power; a plurality of converters 12, each converter being electrically connected to the input 10 to receive electrical power from the input 10 and being configured to convert the electrical power and to provide the converted electrical power to the output 11; and a control unit 14. The method includes, in Step S1, receiving, at the input 10, electrical power from an energy source 24; 24'. In Step S2, the method includes receiving, by the control unit 14, an indication for a current demand. In Step S3, the method includes individually controlling, by the control unit 14, each converter of the plurality of converters 12 based on the indication for the current demand.

The described design of the power supply 1 as a package with a set of multiple power electronics paths allows to optimize each converter 12 individually for the nominal condition and can be switched in parallel to handle higher transient conditions.

Although the disclosure has been described and illustrated more specifically in detail by the exemplary embodiments, the disclosure is not restricted by the disclosed examples and other variations may be derived therefrom by a person skilled in the art without departing from the scope of protection of the disclosure. It is therefore intended that the foregoing description be regarded as illustrative rather than limiting, and that it be understood that all equivalents and/or combinations of embodiments are intended to be included in this description.

It is to be understood that the elements and features recited in the appended claims may be combined in different ways to produce new claims that likewise fall within the scope of the present disclosure. Thus, whereas the dependent claims appended below depend on only a single independent or dependent claim, it is to be understood that these dependent claims may, alternatively, be made to depend in the alternative from any preceding or following claim, whether independent or dependent, and that such new combinations are to be understood as forming a part of the present specification.

LIST OF REFERENCE SIGNS

1 power supply
10 input
11 output
12 converter
120 input
121 output
122 communication interface
13 power path
14 control unit
140 communication interface
141 sensor input
142 communication interface
143 processor
144 memory
15 current sensor
16 communication link
17 communication link
18 cooling system
19 housing
2; 2' aircraft
20 fuselage
21 wings
22 rotor unit
220 rotor blade
23 electric machine
24; 24' energy source
25 turbine
26 power consumer
system 3; 3'
30 power distribution unit
31, 32, 33 power bus

The invention claimed is:

1. A power supply for an aircraft, the power supply comprising:
   a single input configured to receive electrical power from at least one energy source;
   an output for supplying electrical power;
   a plurality of converters, wherein each converter of the plurality of converters is electrically connected to the single input to receive the electrical power from the single input and is configured to convert the electrical power and provide the converted electrical power to the output; and
   a control unit configured to individually control each converter of the plurality of converters,
   wherein the control unit is configured to activate a first predefined number of converters of the plurality of converters when an indication for a current demand indicates a first value, and
   wherein the control unit is configured to activate a second predefined number of converters of the plurality of converters when the indication for the current demand indicates a second value, the second predefined number of converters being different from the first predefined number of converters.

2. The power supply of claim 1, wherein the control unit is configured to individually activate or deactivate each converter of the plurality of converters.

3. The power supply of claim 1, wherein the control unit is configured to receive the indication for the current demand and to individually control each converter of the plurality of converters based on the indication for the current demand.

4. The power supply of claim 3, wherein the control unit comprises a communication interface for receiving the indication for the current demand.

5. The power supply of claim 4, wherein the indication for the current demand is configured to indicate the first value for a regular long-term operation and the second value for a short-term operation, and
   wherein the second value is lower than the first value.

6. The power supply of claim 1, wherein the second predefined number of converters is larger than the first predefined number of converters.

7. The power supply of claim 1, wherein the plurality of converters is a plurality of DC-DC converters.

8. The power supply of claim 1, wherein the plurality of converters is configured to convert a first voltage to a second voltage, and
   wherein the second voltage is lower than the first voltage.

9. The power supply of claim 8, wherein the first voltage is a high voltage, and
   wherein the second voltage is a medium or low voltage.

10. The power supply of claim 1, wherein each converter of the plurality of converters has a same design as each additional converter of the plurality of converters.

11. The power supply of claim 1, wherein the plurality of converters comprises at least two converters.

12. The power supply of claim 1, wherein the control unit comprises a sensor input operatively connected to a current sensor configured to sense a current provided at the output of the power supply.

13. The power supply of claim 1, wherein the control unit is configured to activate at least one first converter of the plurality of converters and deactivate at least one second converter of the plurality of converters at a first point in time,
wherein the control unit is configured to deactivate the at least one first converter of the plurality of converters and activate the at least one second converter of the plurality of converters at a second point in time, and
wherein a period of time between the first point in time and the second point in time is preconfigured.

14. The power supply of claim 1, wherein the control unit is configured to activate and deactivate the plurality of converters at predefined time intervals.

15. A system for an aircraft, the system comprising:
at least one power bus configured to supply electrical power to one or more power consumers;
at least one power supply comprising:
a single input configured to receive electrical power from at least one energy source,
an output for supplying electrical power,
a plurality of converters, wherein each converter of the plurality of converters is electrically connected to the single input to receive the electrical power from the single input and is configured to convert the electrical power and provide the converted electrical power to the output, and
a control unit configured to control each of the plurality of converters,
wherein the control unit is configured to activate a first predefined number of converters of the plurality of converters when an indication for a current demand indicates a first value, and
wherein the control unit is configured to activate a second predefined number of converters of the plurality of converters when the indication for the current demand indicates a second value, the second predefined number of converters being different from the first predefined number of converters; and
a power distribution unit configured to electrically connect the at least one power supply to the at least one power bus.

16. The system of claim 15, wherein the at least one power supply comprises a plurality of power supplies.

17. The system of claim 15, wherein the system is positioned within the aircraft.

18. The system of claim 17, wherein the aircraft is a vertical-take-off-and-landing aircraft.

19. A method of controlling a power supply, wherein the power supply comprises a single input configured to receive electrical power, an output for supplying electrical power, a control unit, and a plurality of converters, and wherein each converter of the plurality of converters is electrically connected to the single input to receive electrical power from the single input and is configured to convert the electrical power and provide the converted electrical power to the output, the method comprising:
receiving, at the single input of the power supply, electrical power from at least one energy source,
receiving, by the control unit of the power supply, an indication for a current demand, and
individually controlling, by the control unit, each converter of the plurality of converters electrically connected to the single input, based on the indication for the current demand,
wherein the control unit activates a first predefined number of converters of the plurality of converters when the indication for the current demand indicates a first value, and
wherein the control unit activate a second predefined number of converters of the plurality of converters when the indication for the current demand indicates a second value, the second predefined number of converters being different from the first predefined number of converters.

20. The power supply of claim 1, wherein the at least one energy source is a single energy source.

* * * * *